United States Patent

[11] 3,633,049

[72] Inventor Suman H. Patel
Arlington, Mass.
[21] Appl. No. 61,926
[22] Filed Aug. 7, 1970
[45] Patented Jan. 4, 1972
[73] Assignee Sylvania Electric Products Inc.

[54] BISTABLE LOGIC CIRCUIT
7 Claims, 5 Drawing Figs.

[52] U.S. Cl. .......... 307/291, 307/247
[51] Int. Cl. .......... H03k 3/286
[50] Field of Search .......... 307/291, 292

[56] References Cited
UNITED STATES PATENTS
3,351,778 11/1967 Seelbach et al. .......... 307/291
3,473,045 10/1969 Niemann .......... 307/291 X

*Primary Examiner*—John S. Heyman
*Attorneys*—Norman J. O'Malley, Elmer J. Nealon and David M. Keay

ABSTRACT: Counter circuit including four bistable stages arranged to count upward through a recurring sequence of combinations of operating states of the bistable stages in response to trigger pulses. An output circuit produces an output signal when the bistable stages have counted upward to the highest count before repeating the sequence. A setting circuit in each bistable stage can switch its stage into either the "1" or "0" state at any time during a sequence. Setting signals are applied at input terminals of each setting circuit and are gated in to set the bistable stages simultaneously by a strobe circuit.

INVENTORS
SUMAN H. PATEL
BY David M. Keay
AGENT

INVENTORS
SUMAN H. PATEL
BY David M. Keay
AGENT

INVENTORS
SUMAN H. PATEL

BY *David M. Kay*

AGENT

INVENTORS
SUMAN H. PATEL
BY David M. Kay
AGENT

INVENTORS
SUMAN H. PATEL

BY David M. Kaay

AGENT

BISTABLE LOGIC CIRCUIT

BACKGROUND OF THE INVENTION

This invention relates to bistable logic circuits. More particularly, it is concerned with flip-flop circuits and with circuitry for setting the operating states of flip-flop circuits.

One type of logic subsystem which is widely used in electronic data processing is a counter. Counter circuits include several bistable flip-flop stages which are interconnected so as to switch through a recurring sequence of combinations of operating states in response to input clock pulses. At a particular point in the counting sequence the counter produces an output signal. The bistable stages of the counter usually may be set to any combination of operating states of the sequence to serve as a starting point for counting through the sequence.

For many applications it is desirable that the bistable stages of a counter be capable of being set to any particular desired starting point at any time during a sequence regardless of the operating states of the stages and regardless of the clock pulse condition at the input to the counter. Generally, the data for determining the setting of the bistable stages should be presented at data input terminals to the counter at any time, and then gated into the counter to set the stages at any selected instant.

It is also desirable to provide a counter circuit which is amenable to fabrication as a monolithic integrated circuit network in which all of the components providing a complete counter are fabricated in a single chip of semiconductor material.

SUMMARY OF THE INVENTION

An improved bistable circuit in accordance with the invention includes a first flip-flop transistor and a second flip-flop transistor. A first flip-flop input circuit means is connected to the first flip-flop transistor and is operable to bias the first flip-flop transistor to a conducting condition when the first flip-flop input circuit means is in a first operating condition, and to bias the first flip-flop transistor to a nonconducting condition when the first flip-flop input circuit means is in a second operating condition. Similarly, a second flip-flop input circuit means is connected to the second flip-flop transistor and is operable to bias the second flip-flop transistor to a conducting condition when the second flip-flop input circuit means is in a first operating condition, and to bias the second flip-flop transistor to a nonconducting condition when the second flip-flop input circuit means is in a second operating condition.

The first flip-flop transistor is coupled to the second flip-flop input circuit means and causes the second flip-flop input circuit means to operate in its second operating condition when the first flip-flop transistor is conducting and causes the second flip-flop input circuit means to operate in its first operating condition when the first flip-flop transistor is not conducting. Similarly, the second flip-flop transistor is coupled to the first flip-flop input circuit means and causes the first flip-flop input circuit means to operate in its second operating condition when the second flip-flop transistor is conducting and causes the first flip-flop input circuit means to operate in its first operating condition when the second flip-flop transistor is not conducting. A triggering means is connected to the first and second flip-flop input circuit means, and in response to an input signal operates to switch the flip-flop input circuit means which is in the first operating condition to the second operating condition, thereby causing the flip-flop transistors to reverse conducting conditions.

A bistable logic circuit in accordance with the invention also includes a first set transistor connected in parallel with the first flip-flop transistor. When conducting, the first set transistor switches the second flip-flop input circuit means to the second operating condition. Similarly a second set transistor is connected in parallel with the second flip-flop transistor; and when conducting, it switches the first flip-flop input circuit means to the second operating condition. Thus, conduction through a set transistor may cause reversal of the conducting conditions of the flip-flop transistors.

A bistable circuit includes a set input terminal and a set control connection. A setting circuit means is connected to the set input terminal and to the set control connection and also is coupled to the two set transistors. When a first signal condition is present at the set input terminal, the setting circuit means operates in response to a control signal at the set control connection to bias the first set transistor to conduction. When a second signal condition is present at the set input terminal, the setting circuit means operates in response to a control signal at the set control connection to bias the second set transistor to conduction.

A counter circuit in accordance with the invention includes a plurality of individual bistable circuits as described above each of which may be considered to be in a first operating state when the first flip-flop transistor is conducting and the second flip-flop transistor is not conducting, and in a second operating state when the first flip-flop transistor is not conducting and the second flip-flop transistor is conducting.

The counter circuit includes an input circuit means which is coupled to the triggering means of each of the bistable circuits for providing simultaneous input signals thereto. Enabling means are coupled between flip-flop transistors and the triggering means of the bistable circuits and operate to selectively inhibit the triggering means of bistable circuits as determined by conducting conditions of the flip-flop transistors so as to cause switching of the bistable circuits through a predetermined recurring sequence of combinations of operating states in response to input signals from the input circuit means.

The counter circuit also includes a set control terminal and set control circuit means connected to the set control terminal and to the set control connections of the plurality of bistable circuits. In response to a set control input signal at the set control terminal the set control means produces a control signal at the set control connection permitting the operating states of the bistable circuits to be set in accordance with the signal conditions present at the set input terminals of the bistable circuits.

BRIEF DESCRIPTION OF THE DRAWINGS

Various objects, features, and advantages of bistable circuits in accordance with the invention will be apparent from the following detailed discussion and the accompanying drawings wherein.

DETAILED DESCRIPTION OF THE INVENTION

Binary Counter Circuit—General

Figure 1A:
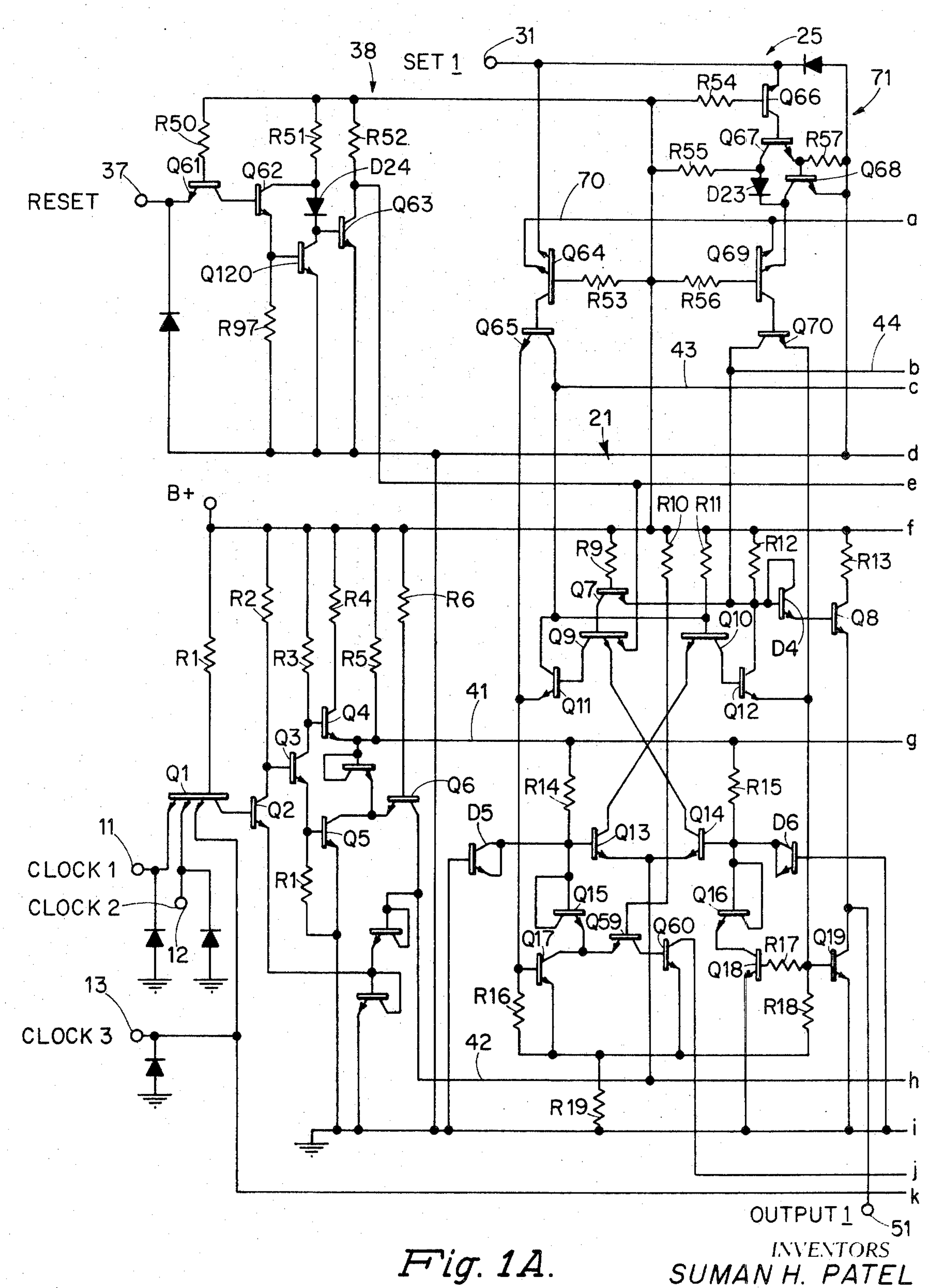
FIGS. 1A, 1B, and 1C form a detailed schematic circuit diagram of a binary counter circuit employing bistable logic circuits in accordance with the invention.
Figure 1B:
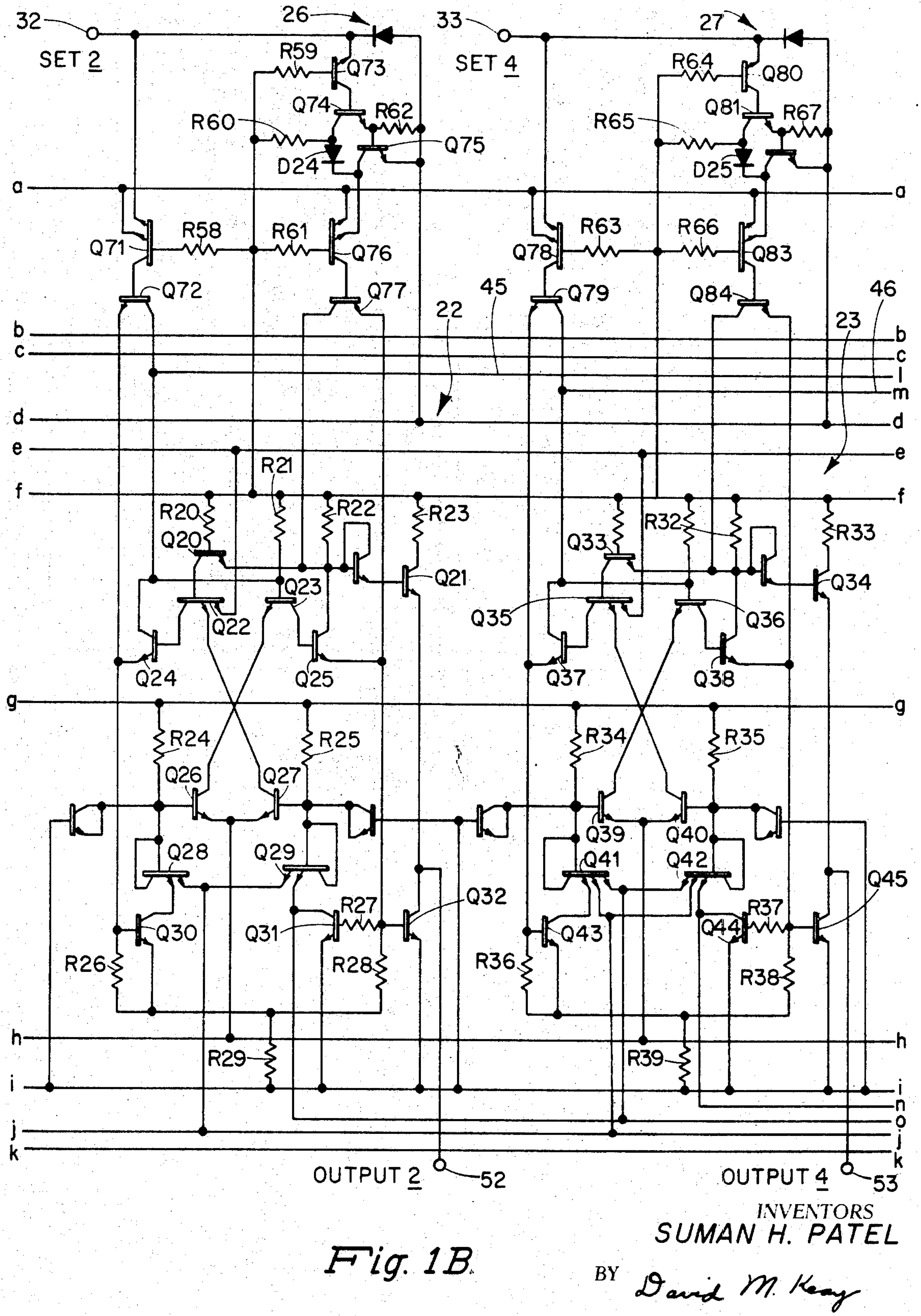
Figure 1C:
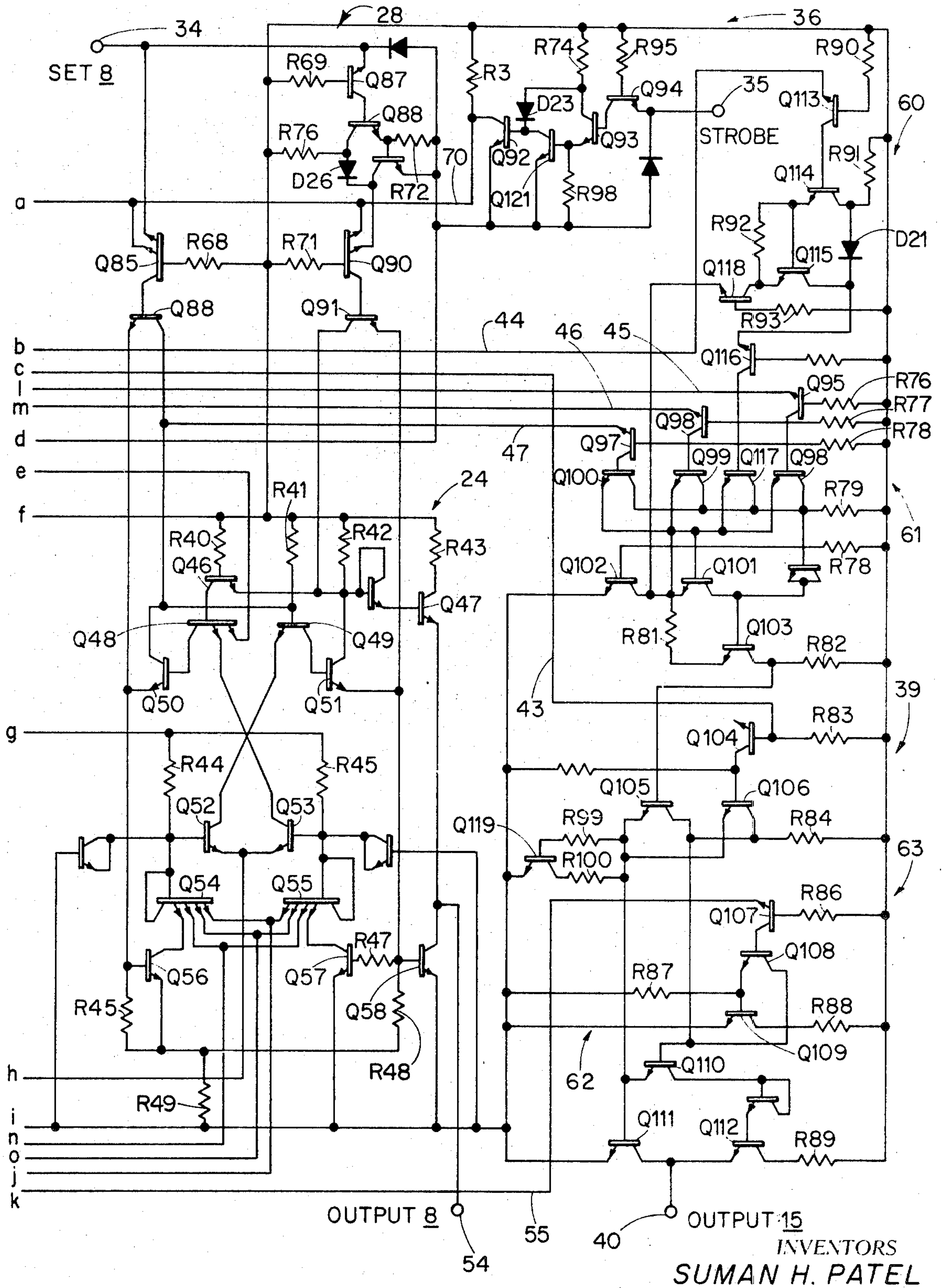
Figure 2:
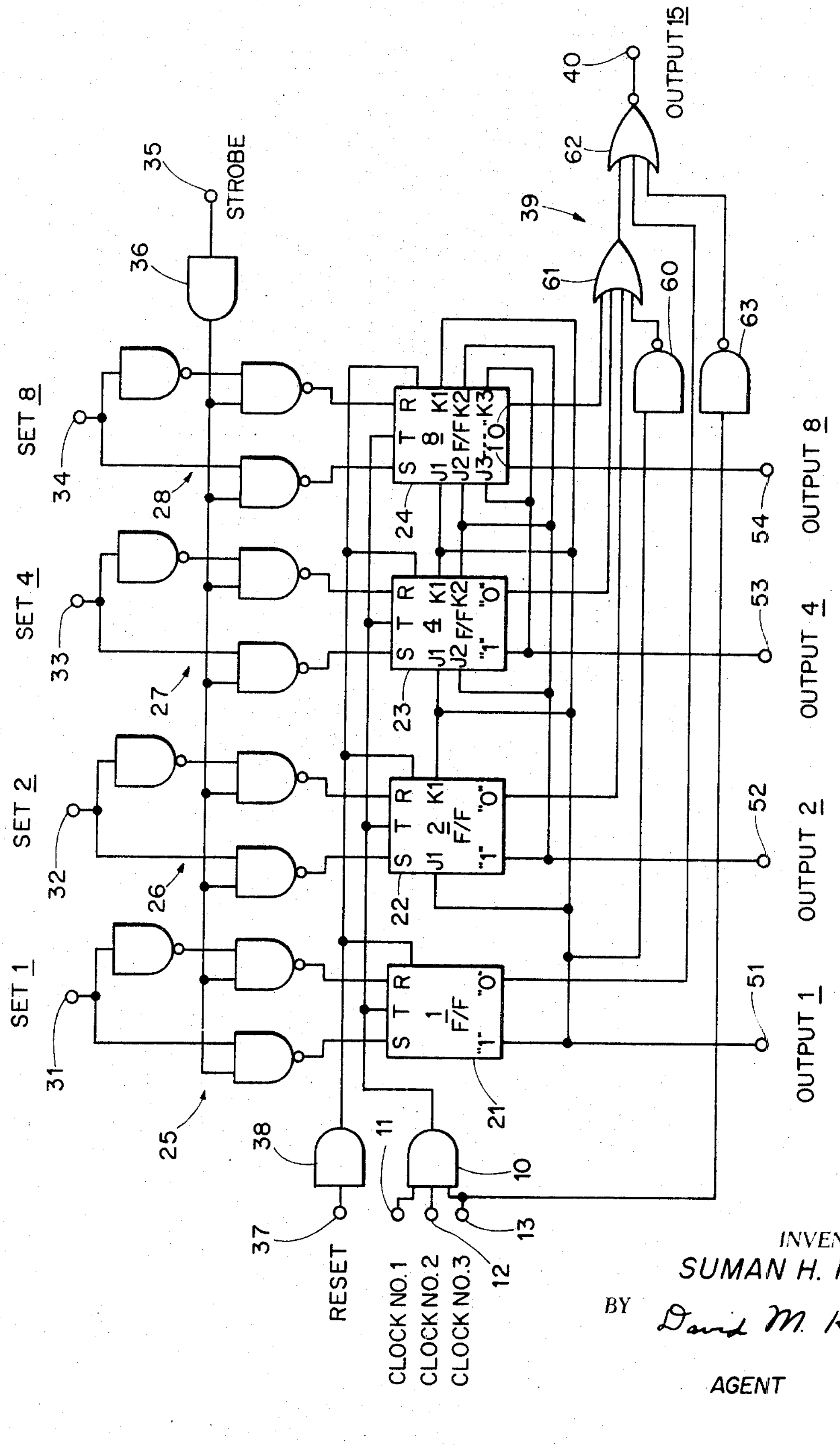
FIG. 2 is an equivalent logic diagram of the binary counter circuit of FIGS. 1A, 1B, and 1C.

FIGS. 1A, 1B, and 1C form a schematic circuit diagram of a binary counter circuit employing bistable circuits in accordance with the invention. Its equivalent logic diagram is illustrated in FIG. 2. The counter circuit includes an input control and pulse shaping section 10 having three clock pulse input terminals 11, 12 and 13. Four bistable stages 21, 22, 23 and 24 are arranged to receive trigger pulses from the input section and to count up continually through a sequence of 16 combinations of operating states of the bistable stages to provide a binary counter.

The bistable stages may be set to any one of the 16 combinations of operating states by setting circuitry 25, 26, 27, and 28 connected to each of the bistable stages. Each setting circuit has a set input terminal 31, 32, 33, and 34 for applying setting input data to the counter. The setting input data is gated into the bistable stages by a signal at the strobe input terminal 35 of a strobe circuit 36. The bistable stages can all be reset by a suitable signal at the reset input terminal 37 of a reset circuit 38.

Output connections from the bistable stages are made to an output section 39. The output section produces an output pulse at its output terminal 40 when a particular combination of operating states of the bistable stages occurs.

Input Control and Pulse Shaping Section

The input control and pulse shaping section 10 (see FIG. 1A) includes an NPN multiemitter input transistor Q1 which provides an AND input gate to the pulse shaper. Positive-going clock pulses applied at one of the clock pulse input terminals 11, 12 and 13 are passed through the AND gate when the other clock pulse input terminals are either open circuited or have a relatively high-voltage level signal applied thereto. Clock pulses are shaped by the pulse shaping circuit to provide a positive-going trigger pulses having improved leading and trailing edges. Each trigger pulse appears on the two output lines 41 and 42 from the pulse shaping circuit and is applied to the switching circuitry of the bistable stages 21, 22, 23, and 24.

Bistable Stages and Interconnections

Each of the bistable stages is basically a J-K flip-flop circuit of the type described in U.S. Pat. No. 3,384,766 issued May 21, 1968, to John J. Kardash entitled "Bistable Logic Circuit," and also in application Ser. No. 703,974, filed Feb. 8, 1968, by Shu-kuang Ho and John J. Kardash entitled "Programmable Frequency Divider" now Pat. No. 3,518,553 issued June 30, 1970; both assigned to the assignee of the present invention. A bistable stage, for example the first stage 21, may be considered to be in the "O" operating state when its first flip-flop transistor Q11 is nonconducting and its second flip-flop transistor Q12 is conducting. The flip-flop transistors Q11 and Q12 are maintained in these conducting conditions by feedback connections. First and second flip-flop input transistors Q9 and Q10 have their collectors connected to the bases of their associated flip-flop transistors Q11 and Q12 and their bases coupled to the collectors of the opposite flip-flop transistors Q12 and Q11, respectively. When the conducting conditions are reversed such that transistor Q12 is not conducting and transistor Q11 is conducting, the bistable stage may be considered to be in the "1" operating state.

The operating state of the bistable stage is reversed by the receipt of a trigger pulse over the lines 41 and 42 from the input control and pulse shaping section 10. The trigger pulse is applied to switching circuitry in the bistable stage. If the switching circuitry is appropriately conditioned for switching, a charge is stored during the trigger pulse. On the trailing edge of the pulse the switching circuitry employs the stored charge to cause the flip-flop transistors of the stage to reverse conducting conditions.

During the occurrence of a positive-going trigger pulse, whichever control transistor Q17 or Q18 of the stage is in the nonconducting condition by virtue of its base being connected to the emitter of the nonconducting flip-flop transistor Q11 or Q12, respectively, permits a charge to be stored in the base-emitter junction of the associated switching transistor Q13 or Q14 and also in the junction of the associated charge storage diode D5 or D6. The control transistor Q17 or Q18 having its base connected to the emitter of the conducting flip-flop transistor Q11 or Q12, respectively, is biased into conduction during the positive-going trigger pulse thereby causing current flow through the associated resistance R14 or R15 and preventing a charge from being stored in the associated switching transistor Q13 and Q14 and the associated charge storage diode D5 or D6. Since the emitters of the switching transistors Q13 and Q14 are connected to the line 42 from the input section 10, both transistors are prevented from becoming conductive during the trigger pulse.

During the trailing edge of the trigger pulse, a switching transistor Q13 or Q14 having a charge stored in its base-emitter junction and in its associated charge storage diode D5 or D6 is biased to conduction. Current flowing through the switching transistor Q13 or Q14 causes current to flow across the base-emitter junction of the flip-flop input transistor Q10 or Q9 connected to its collector. Current flow through the conducting flip-flop transistor Q12 or Q11 having its base connected to the collector of the affected flip-flop input transistor is reduced, thereby initiating switching action which reverses the operating conditions of the flip-flop transistors. The charge stored in the diode D5 or D6 serves to sustain conduction in the switching transistor Q13 or Q14 for a sufficient period to insure switching.

The other three bistable stages 22, 23, and 24 operate in the same manner during each trigger pulse to change operating conditions when the switching transistor and charge storage diode associated with the flip-flop transistor in the nonconducting condition are not prevented from storing the charge. For example, in the second bistable stage 22 when the flip-flop transistor Q24 is nonconducting and the flip-flop transistor Q25 is conducting, the control transistor Q30 is biased to nonconduction. Therefore, during a trigger pulse a charge should be stored in the switching transistor Q26 and in the charge storage diode D8, so that on the trailing edge of the trigger pulse the operating conditions of the flip-flop transistors would be reversed. However, if a base-emitter junction of inhibiting transistor Q28 (may also be considered a diode since the collector is shorted to the base) is forward biased by virtue of the connection to an emitter, current flows through resistance R24 and no charge will be stored during the trigger pulse and the flip-flop transistors will not change operating conditions.

One of the emitters of inhibiting transistor Q28 is coupled by way of an inverting arrangement of transistors Q59 and Q60 to the collector of control transistor Q17 in the first bistable stage 21. Thus, when control transistor Q17 is conducting by virtue of flip-flop transistor Q11 being in a conducting condition, transistor Q60 is biased in a nonconducting condition and therefore current cannot flow across the one base-emitter junction of inhibiting transistor Q28. When control transistor Q17 is in the nonconducting condition, transistor Q60 is biased so as to permit conduction therethrough. Under these conditions trigger pulse current flows through resistance R24, across the one base-emitter junction of inhibiting input connection such that it is conditioned to be switched from the "O" operating state (flip-flop transistor Q24 nonconducting, flip-flop transistor Q25 conducting) to the "1" operating state (flip-flop transistor Q24 conducting, flip-flop transistor Q25 nonconducting) only when the first bistable stage 21 is in the "1" operating state (flip-flop transistor Q11 conducting, flip-flop transistor Q12 nonconducting).

A second inhibiting transistor Q29 in the second bistable stage 22 also has one emitter coupled to the collector of the control transistor Q17 in the first bistable stage 21 through the inverting arrangement of transistors Q59 and Q60. Thus, the inhibiting input connections from the first bistable stage 21 to the two inhibiting transistors Q28 and Q29 of the second bistable stage 22 are such that the second bistable stage is conditioned to permit switching from either of the operating states to the other only when the first bistable stage 21 is in the "1" operating state.

Inhibiting transistors in the third and fourth bistable stages 23 and 24 have emitters coupled to the collectors of various control transistors so as to provide similar inhibiting functions. However, except for connections to control transistor Q17 which are through the inverting arrangement, direct connections are made from the emitters of the inhibiting transistors to the collectors of appropriate control transistors. Employing the terminology commonly used in conjunction with J-K flip-flop circuits, those input connections to a bistable stage which must be energized by appropriate signals in order to condition the circuit for switching from the "0" operating state to the "1" operating state are designated J input connections and those which must be appropriately energized to condition the bistable circuit for switching from the "1" operating state to the "0" operating state are designated K inputs.

In the counter circuit shown in FIGS. 1A, 1B, and 1C and in the logic diagram of FIG. 2 the bistable stages are appropriately interconnected so as to condition the stages for switching through a recurring sequence of sixteen combinations of operating states from 0 0 0 0 (operating states of first, second, third, and fourth bistable stages 21, 22, 23, and 24, respectively), to 1 1 1 1. The bistable stages 21, 22, 23, and 24 may be designated as having values 1, 2, 4, and 8, respectively, when in the "1" operating state. Therefore, the 0 0 0 0 combination of operating states is designated as value 0 and the 1 1 1 1 combination is designated as value 15. The sequence of combinations is a digital counting upward in order from the value 0 to the value 15.

As shown in FIGS. 1A, 1B, and 1C output connections are provided from the bistable stages to the output section 39 by output lines 43, 44, 45, 46, and 47 connected directly to the collectors of flip-flop transistors Q11 and Q12 of the first bistable stage 21, and flip-flop transistors Q24, Q37, and Q50, of the second, third, and fourth bistable stages 22, 23, and 24, respectively. The level of the output voltage on a line is relatively high when the respective flip-flop transistor is nonconducting and is relatively low when the flip-flop transistor is conducting.

The second flip-flop transistors Q12, Q25, Q38, and Q51 of the four bistable states 21, 22, 23, and 24, are connected through output arrangements to output terminals 51, 52, 53, and 54, respectively. For example, in the first bistable stage 21 transistor Q19 has its collector connected to the output terminal 51 and its base connected to the emitter of the second flip-flop transistor Q12. Thus, when transistor Q12 is in the conducting condition (stage in "O" operating state), transistor Q19 is also conducting and the voltage level at the output terminal 51 is relatively low. When the second flip-flop transistor Q12 is in the nonconducting condition (stage in "1" operating state) transistor Q19 is not conducting and a relatively high voltage level is produced at the output terminal 51. Transistor Q8 conducts to charge any load and establish the relatively high-voltage level on the output terminal 51 when transistors Q12 and Q19 are switched from conducting to nonconducting conditions. Output arrangements in the other bistable stages operate in a similar manner to provide relatively high-voltage levels at the output terminals 52, 53, and 54 when the associated stage is in the "1" operating state and to provide relatively low-voltage levels at the output terminals when the associated stage is in the "O" operating state.

Output Section

The output section 39 receives signals from the bistable stages over the lines 43, 44, 45, 46, and 47 and from the third clock input terminal 13 over line 55, and produces a positive-going signal at its output terminal 40 when all the bistable stages are in the "1" operating state (indicating a value 15) and an appropriate signal condition is present at the third clock input terminal 13. The following is a brief description of the output section and its operation. It is described in greater detail in application Ser. No. 61,919 filed concurrently herewith by Suman H. Patel, entitled "Counter Circuit" and assigned to the assignee of the present invention.

The output section 39 includes an inverting circuit 60 connected to line 44 from the collector of the second flip-flop transistor Q12 of the first bistable stage 21. The output of the inverting circuit 60 is applied to an OR arrangement 61 at the emitter of transistor Q116. The collectors of the first flip-flop transistors Q24, Q37, and Q50 of the second, third, and fourth bistable stages 22, 23, and 24 are connected by lines 45, 46, and 47 to the emitters of transistors Q95, Q96, and Q97, respectively, of the OR-arrangement arrangement 61. The output of the OR-arrangement 61 is applied by way of transistor Q103 to the base of transistor Q105 in a NOR-circuit 62. The collector of the first flip-flop transistor Q11 of the first bistable stage 21 is coupled by line 43 and transistor Q104 to the base of transistor Q106 of the NOR-circuit 62. The third clock input terminal 13 is connected through an inverting arrangement 63 of transistors Q107, Q108, and Q109 to the base of transistor Q110 of the NOR-circuit 62.

When all of the bistable stages 21, 22, 23, and 24 are in the "1" operating state, a relatively high-voltage level is present on line 44 to the inverting circuit 60, and a relatively low-voltage level is present on lines 45, 46 and 47 to the OR-arrangement 61 and on line 43 to the NOR-circuit 62. Under these conditions both transistors Q105 and Q106 of the NOR-circuit 62 are in the nonconducting condition. If at the same time the third clock input terminal 13 is either not connected or has a relatively high-voltage level applied thereto, transistor Q110 of the NOR circuit will also be nonconducting. With all three transistors Q105, Q106, and Q110 nonconducting, output transistor Q111 will also be nonconducting and a relatively high-voltage level output signal is established at the output terminal 40. If any of the signal conditions at the input connections to the output section 39 are different, one of transistors Q105, Q106, and Q110 will conduct causing output transistor Q111 to conduct and establish a low voltage level at the output terminal 40.

Thus, the output section 39 produces a high output voltage level signal only when all of the bistable stages 21, 22, 23, and 24 are in the "1" operating state (indicating a value 15) and the third clock input terminal 13 is either not connected or a relatively high voltage level is present thereon. As explained in greater detail in the above-mentioned application filed concurrently herewith, the time of triggering the NOR-circuit 62 to produce a high-voltage level at the output terminal 40 after the final clock pulse of the count is determined by the action of flip-flop transistor Q12 being switched to the nonconducting condition and the subsequent delays through the inverting circuit 60 and the OR-arrangement 61. The time of triggering the NOR-circuit 62 to restore the low-voltage level at the output terminal 40 after the next succeeding clock pulse is determined by the action of flip-flop transistor Q11 being switched to the nonconducting condition.

Setting Circuitry

The counter circuit may be cleared, that is, all the bistable stages set to the "O" operating state by the application of a pulse of relatively low-voltage level to the reset terminal 37. Under normal operating conditions a relatively high-voltage level is maintained at the reset terminal 37. A low-voltage level at the reset terminal 37 biases transistor Q63 to conduction and forward biases the base-emitter junctions of the first flip-flop input transistors Q9, Q22, Q35, and Q48 of each of the bistable stages. Current flow through these transistors reduces the voltage level at their collectors thereby reducing conduction through any of the associated first flip-flop transistors Q11, Q24, Q37, and Q50 which may be conducting. The switching goes to completion setting all the second flip-flop transistors Q12, Q25, Q38, and Q51 in the conducting condition and thus all the bistable stages in the "O" operating state.

In order to set the counter to any selected one of the combinations of operating states, the bistable stages are individually set to either the "1" or "O" operating state by means of setting circuits 25, 26, 27, and 28 under the control of the strobe circuit 36. Each setting circuit includes a set input terminal 31, 32, 33, and 34 for receiving setting information signals. A positive-going pulse at the strobe input terminal 35 causes the strobe circuit 36 to gate the setting information data to the bistable stages and set the bistable stages to the appropriate operating states.

The setting circuit 25 of the first bistable stage 21 includes a first set transistor Q65 connected in parallel with the first flip-flop transistor Q11 with their collectors and emitters connected directly together. A dual-emitter gating transistor Q64 has its collector connected directly to the base of the first set transistor Q65 and its base connected through a resistance R53 to the B+ voltage source. One emitter of the dual-emitter transistor Q64 is connected directly to the set input terminal 31 and the other emitter is connected directly to a control line 70 from the strobe circuit 36.

A second set transistor Q70 is connected in parallel with the second flip-flop transistor Q12 with their collectors and emitters connected directly together. The base of the second set transistor Q70 is connected directly to the collector of a second dual7emitter gating transistor Q69. The base of transistor Q69 is connected through a resistance R56 to the B+ voltage source. One emitter of transistor Q69 is connected through an inverter 71 to the set input terminal 31 and the second emitter is connected directly to the strobe control line 70.

The inverter 71 includes a transistor Q66 having its emitter connected directly to the set input terminal 31, its base coupled through a resistance R54 to the B+ voltage source, and its collector connected directly to the base of transistor Q67. The collectors of transistor Q67 and transistor Q68 are connected together and through a resistance R55 to the B+ voltage source. The emitter of transistor Q67 is connected directly to the base of the transistor Q68 and through a resistance R57 to ground. The emitter of transistor Q68 is connected directly to ground. The juncture of the collectors of transistors Q67 and Q68 and the collector resistance R55 is connected directly to the emitter of the second dual-emitter gating transistor Q69.

The strobe circuit 36 is connected to the strobe input terminal 35 and to the control line 70. Under normal operating conditions a relatively low voltage level is maintained at the strobe input terminal 35 producing a relatively low-voltage level on the control line 70. The base-second emitter junctions of all the dual-emitter gating transistors Q64, Q69, Q71, Q76, Q78, Q83, Q85, and Q90 in the four stages are thus forward biased, biasing all the set transistors Q65, Q70, Q72, Q77, Q79, Q84, Q86, and Q91 in the nonconducting condition. When a positive-going pulse is applied at the strobe input terminal 35, a positive-going signal appears on the control line 70 thus causing one or the other of the two dual-emitter gating transistors Q64 or Q69, Q71, or Q76, Q78 or Q83, and Q85 or Q90 in each bistable stage to bias its associated set transistor Q65, or Q70, Q72, or Q77, Q79 or Q84, and Q86 to Q91 to conduction and set the bistable stages in accordance with the set input conditions at input terminals 31, 32, 33, and 34 as will be explained hereinbelow.

When a positive relatively high voltage level signal condition is present at the set input terminal 31 indicating that a "1" is to be set into the first bistable stage 21, the first emitter of gating transistor Q64 has the relatively high voltage applied thereto. At the same time, the relatively high-voltage level at the set input terminal 31 is inverted by the inverter 71 producing a relatively low-voltage level at the first emitter of gating transistor Q69. Under these conditions a positive-going signal on the control line 70 from the strobe circuit 36 causes both emitters of transistor Q64 to be reversed biased increasing the voltage at its collector and biasing the first set transistor Q65 into conduction. Since the first emitter of transistor Q69 is at a relatively low-voltage level, the presence of a high-voltage level signal on the control line 70 has no effect on the second set transistor Q70.

When the set transistor Q65 conducts, regardless of which flip-flop transistor Q11 or Q12 is in the conducting condition, current flows through resistance R11 reducing the voltage at the base of input transistor Q10 and consequently at the base of the second flip-flop transistor Q12. If transistor Q12 has been in the conducting condition, current flow through its collector circuit is reduced raising the voltage level at its collector and at the emitter of transistor Q7 and, consequently at the collector of transistor Q7. Thus, the voltage at the base of transistor Q9 is increased raising the voltage at its collector and at the base of the first flip-flop transistor Q11. Current flows through transistor Q11 and the switching action goes to completion with the feedback connections maintaining transistor Q11 in the conducting condition and transistor Q12 in the nonconducting condition. These conditions remain stable after termination of the strobe input pulse when set transistor Q65 is no longer in the conducting condition. Thus, the bistable stage is switched to the "1" operating state.

When a relatively low voltage level signal condition is present at the set input terminal 31 indicating that a "0" is to be set into the first bistable stage 21, the emitter of gating transistor Q64 remains at a low-voltage level. The low-voltage level is inverted by the inverter 71 to produce a relatively high voltage level at the first emitter of gating transistor Q69. Thus, during a strobe input pulse at the strobe input terminal 35 which produces a high-voltage level on the control line 70, there is no effect on the first set transistor Q65, but the voltage at the collector of gating transistor Q69 increases and the second set transistor Q70 is biased to conduction.

Conduction through the second set transistor Q70 reduces the voltage at the emitter of transistor Q7 and consequently at the base of switching transistor Q9. The voltage at the base of the first flip-flop transistor Q11 is thereby reduced. If transistor Q11 has been in the conducting condition, current flow therethrough is reduced causing the voltage at the base of the second flip-flop input transistor Q10 to increase. Thus, the voltage at its collector and consequently at the base of the flip-flop transistor Q12 is increased. Current flows through transistor Q12 and the switching action goes to completion with the feedback connections maintaining transistor Q11 in the nonconducting condition and transistor Q12 in the conducting condition. These conditions remain stable after termination of the strobe input pulse when set transistor Q70 ceases to conduct. Thus, the first bistable stage is set to the "0" operating state.

The setting circuits 26, 27, and 28 of the second, third and fourth bistable stages 22, 23, and 24 operate in a similar manner during a strobe input pulse at the strobe input terminal 35 to set the stages in accordance with the setting data applied at the set input terminals 32, 33, and 34 respectively.

The setting circuitry as described positively drives the appropriate flip-flop transistor of each bistable stage into its conducting condition. Setting occurs regardless of the previous or existing operating states of the bistable stages; and, therefore, a clear or reset signal is not required prior to the strobe pulse which gates the data into the stages. In addition, the condition of the clock pulse at the input to the counter has no effect on the setting of the bistable stages, and the setting can occur at any time during a clock pulse cycle.

Decade Counter

Figure 3:
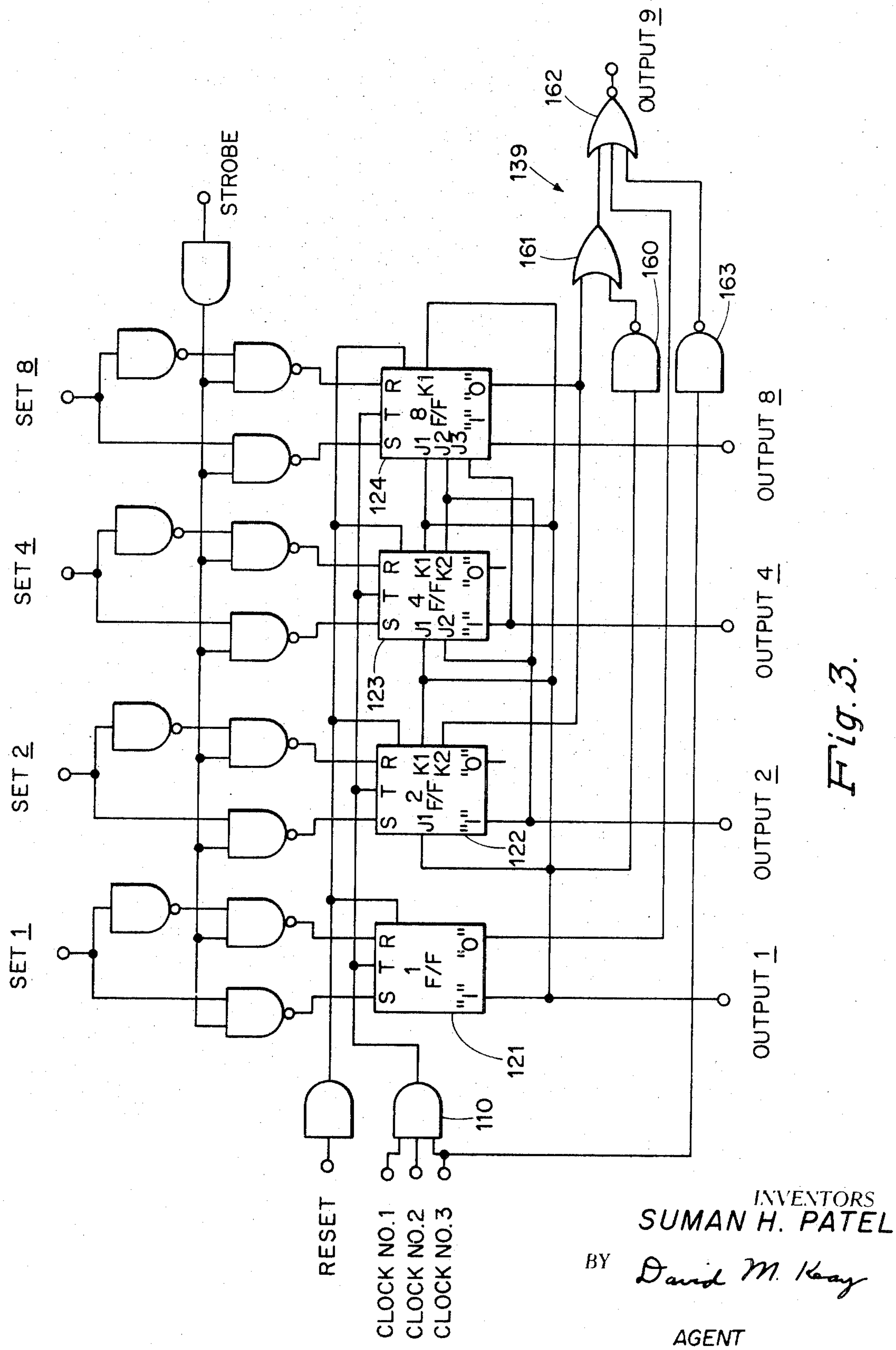
FIG. 3 is an equivalent logic diagram of a decade counter circuit in accordance with the invention.

FIG. 3 is a logic diagram of a decade counter similar to the binary counter of FIGS. 1A, 1B, and 1C, and 2 except that the circuit counts upward through a recurring sequence of ten combinations of operating states of the bistable stages rather than 16. The input control and pulse shaping section 110, the individual bistable stages 121, 122, 123, and 124, and the setting circuitry are the same as those shown in the logic diagram of FIG. 2 and the circuit diagram of FIGS. 1A, 1B, and 1C. The interconnections between the flip-flop transistors and the inhibiting transistors of other stages, which constitute J and K input connections, are such as to establish a recurring sequence of 10 combinations of operating states to provide a decade counter. The output section 139 is simplified from that in FIGS. 1 and 2 since information on the operating states of only the first and fourth bistable stages 121 and 124 are required in order to determine the existence of the 1 0 0 1 (value 9) combination of operating states.

While there has been shown and described what is considered a preferred embodiment of the present invention, it will be obvious to those skilled in the art that various changes and modifications may be made therein without departing from the invention as defined in the appended claims.

What is claimed is:

1. A bistable circuit including in combination
- a first flip-flop transistor;
- a second flip-flop transistor;
- a first flip-flop input circuit means connected to the first flip-flop transistor and operable to bias the first flip-flop transistor to a conducting condition when in a first operating condition and to bias the first flip-flop transistor to a nonconducting condition when in a second operating condition;
- a second flip-flop input circuit means connected to the second flip-flop transistor and operable to bias the second flip-flop transistor to a conducting condition when in a first operating condition and to bias the second flip-flop transistor to a nonconducting condition when in a second operating condition;

said first flip-flop transistor being coupled to the second flip-flop input circuit means and being operable to cause the second flip-flop input circuit means to operate in the second operating condition when the first flip-flop transistor is in the conducting condition and being operable to cause the second flip-flop input circuit means to operate in the first operating condition when the first flip-flop transistor is in the nonconducting condition;

said second flip-flop transistor being coupled to the first flip-flop input circuit means and being operable to cause the first flip-flop input circuit means to operate in the second operating condition when the second flip-flop transistor is in the conducting condition and being operable to cause the first flip-flop input circuit means to operate in the first operating condition when the second flip-flop transistor is in the nonconducting condition;

triggering means connected to the first flip-flop input circuit means and to the second flip-flop input circuit means and operable in response to an input signal thereto to switch a flip-flop input circuit means from the first operating condition to the second operating condition;

a first set transistor connected in parallel with the first flip-flop transistor and operable when biased in the conducting condition to switch the second flip-flop input circuit means from the first operating condition to the second operating condition;

a second set transistor connected in parallel with the second flip-flop transistor and operable when biased in the conducting condition to switch the first flip-flop input circuit means from the first operating condition to the second operating condition;

a set input terminal;

a set control connection; and setting circuit means connected to the set input terminal and the set control connection and coupled to the first set transistor and to the second set transistor and being operable to bias the first set transistor to the conducting condition in response to the presence of a control signal at the set control connection when a first signal condition is present at the set input terminal and being operable to bias the second set transistor to the conducting condition in response to the presence of a control signal at the set control connection when a second signal condition is present at the set input terminal.

2. A bistable circuit in accordance with claim 1 wherein the collector of the first set transistor is connected directly to the collector of the first flip-flop transistor and the emitter of the first set transistor is connected directly to the emitter of the first flip-flop transistor;

the collector of the second set transistor is connected directly to the collector of the second flip-flop transistor and the emitter of the second set transistor is connected directly to the emitter of the second flip-flop transistor;

the first input circuit means is connected to the base of the first flip-flop transistor;

the second input circuit means is connected to the base of the second input circuit means is connected to the base of the second flip-flop transistor; and said setting circuit means includes a first condition set means connected to the set input terminal, the set control connection, and the base of the first set transistor and operable to bias the first set transistor to the conducting condition in response to the presence of a control signal at the set control connection when the first signal condition is present at the set input terminal, and a second condition set means connected to the set input terminal, the set control connection, and the base of the second set transistor and operable to bias the second set transistor to the conducting condition in response to the presence of a control signal at the set control connection when the second signal condition is present at the set input terminal.

3. A bistable circuit in accordance with claim 2 wherein the collectors of the first flip-flop transistor and the first set transistor are connected to the second flip-flop input circuit means;

the collectors of the second flip-flop transistor and the second set transistor are connected to the first flip-flop input circuit means;

said first condition set means being operable to bias the first set transistor to the conducting condition in response to a first voltage level, corresponding to the presence of The control signal, being present on the set control connection when a first voltage level, corresponding to the first signal condition, is present at the set input terminal; and said second condition set means being operable to bias the second set transistor to the conducting condition in response to the first voltage level, corresponding to the presence of the control signal, being present on the set control connection when a second voltage level, corresponding to the second signal condition, is present at the set input terminal.

4. A bistable circuit in accordance with claim 3 wherein said first condition set means includes a transistor gating means having a first input electrode connected to the set input terminal and a second input electrode connected to the set control connection, said transistor gating means being biased to cause current to flow into the base of the first set transistor biasing the first set transistor to the conducting condition when the first voltage level is present at the first and second input electrodes;

said second condition set means includes a transistor gating means having a first input electrode and a second input electrode, an inverting means connected to the set input terminal and to the first input terminal and to the first input electrode and operable to produce the second voltage level at the first input electrode during the presence of the first voltage level at the set input terminal and operable to produce the first voltage level at the first input electrode during the presence of the second voltage level at the set input terminal, the second input electrode of the transistor circuit means being connected to the set control connection, and said transistor gating means being biased to cause current to flow into the base of the second set transistor biasing the second set transistor to the conducting condition when the first voltage level is present at the first and second input electrodes.

5. A bistable circuit in accordance with claim 4 wherein said first flip-flop input circuit means includes a first flip-flop input transistor having its collector connected to the base of the first flip-flop transistor and its base coupled to the collectors of the second flip-flop transistor and the second set transistor;

said second flip-flop input circuit means includes a second flip-flop input transistor having its collector connected to the base of the second flip-flop transistor and its base coupled to the collectors of the first flip-flop transistor and the first set transistor;

the transistor gating means of the first condition set means includes a transistor having its collector connected to the base of the first set transistor, a first emitter connected to the set input terminal, and a second emitter connected to the set control connection; and the transistor gating means of the second condition set means includes a transistor having its collector connected to the base of the second set transistor, a first emitter connected to the inverting means, and a second emitter connected to the set control connection.

6. A counter circuit including in combination a plurality of bistable circuits in accordance with claim 1, each bistable circuit being in a first operating state when the first flip-flop transistor is in the conducting condition and the second flip-flop transistor is in the nonconducting condition and being in a second operating state when the first flip-flop transistor is in the nonconducting condition and the second flip-flop transistor is in the conducting condition;

an input circuit means coupled to the triggering means of each of the bistable circuits and operable to provide simultaneous input signals thereto;

enabling means coupled between flip-flop transistors and the triggering means of the bistable circuits and operable to selectively inhibit the triggering means of bistable circuits as determined by conducting conditions of the flip-flop transistors so as to cause switching of the bistable circuits through a predetermined recurring sequence of combinations of operating stages in response to input signals from the input circuit means;

a set control terminal; and set control circuit means connected to the set control terminal and to the set control connections of the plurality of bistable circuits and operable to produce a control signal at the set control connections in response to a set control input signal at the set control terminal.

7. A counter circuit including in combination a plurality of bistable circuits in accordance with claim 4, each bistable circuit being in a first operating state when the first flip-flop transistor is in the conducting condition and the second flip-flop transistor is in the nonconducting condition and being in a second operating state when the first flip-flop transistor is in the nonconducting condition and the second flip-flop transistor is in the conducting condition;

an input circuit means coupled to the triggering means of each of the bistable circuits and operable to provide simultaneous input signals thereto;

enabling means coupled between flip-flop transistors and the triggering means of the bistable circuits and operable to selectively inhibit the triggering means of bistable circuits as determined by conducting conditions of the flip-flop transistors so as to cause switching of the bistable circuits through a predetermined recurring sequence of combinations of operating states in response to input signals from the input circuit means;

a set control terminal; and set control circuit means connected to the set control terminal and to the set control connections of the plurality of bistable circuits and operable to produce the first voltage level at the set control connections in response to the presence of the first voltage level at the set control terminal and operable to produce the second voltage level at the set control connections in response to the presence of the second voltage level at the set control terminal.

* * * * *